US012469738B2

(12) United States Patent
Matsuura et al.

(10) Patent No.: US 12,469,738 B2
(45) Date of Patent: Nov. 11, 2025

(54) SUBSTRATE SUPPORT, PLASMA PROCESSING APPARATUS, AND RING REPLACEMENT METHOD

(71) Applicant: Tokyo Electron Limited, Tokyo (JP)

(72) Inventors: Shin Matsuura, Miyagi (JP); Nobutaka Sasaki, Miyagi (JP); Gyeong min Park, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 429 days.

(21) Appl. No.: 18/075,451

(22) Filed: Dec. 6, 2022

(65) Prior Publication Data

US 2023/0178417 A1 Jun. 8, 2023

(30) Foreign Application Priority Data

Dec. 7, 2021 (JP) ................. 2021-198257

(51) Int. Cl.
H01L 21/687 (2006.01)
H01L 21/67 (2006.01)
H01L 21/677 (2006.01)

(52) U.S. Cl.
CPC .. H01L 21/68742 (2013.01); H01L 21/67069 (2013.01); H01L 21/67751 (2013.01); H01L 21/68735 (2013.01)

(58) Field of Classification Search
CPC ......... H01L 21/67069; H01L 21/67751; H01L 21/68735; H01L 21/68742
See application file for complete search history.

(56) References Cited

U.S. PATENT DOCUMENTS

| | | | | |
|---|---|---|---|---|
| 2012/0175063 | A1* | 7/2012 | Yamawaku | H01L 21/67069 156/345.46 |
| 2012/0176692 | A1* | 7/2012 | Yamawaku | H01J 37/32724 359/825 |
| 2020/0185256 | A1* | 6/2020 | Nguyen | H01J 37/32623 |
| 2020/0234928 | A1* | 7/2020 | Vishwanath | H01L 21/68742 |
| 2020/0234981 | A1* | 7/2020 | Schmid | H01L 21/68785 |
| 2020/0303233 | A1* | 9/2020 | Lee | H01L 21/68757 |
| 2020/0395195 | A1* | 12/2020 | Sanchez | H01L 21/67069 |

(Continued)

FOREIGN PATENT DOCUMENTS

| | | |
|---|---|---|
| JP | 2012-146743 A | 8/2012 |
| JP | 2019-505088 A | 2/2019 |

(Continued)

Primary Examiner — Saul Rodriguez
Assistant Examiner — Brendan P Tighe
(74) Attorney, Agent, or Firm — XSENSUS LLP

(57) ABSTRACT

There is a substrate support comprising: a substrate supporting portion; a first ring disposed to surround the substrate supporting portion; a second ring surrounding the first ring without overlapping the first ring in plan view; a third ring disposed below the first ring and the second ring such that an inner portion of the third ring overlaps the first ring in plan view and an outer portion of the third ring overlaps the second ring in plan view, and having a hole at the inner portion of the third ring; a lifter having a first engaging portion protruding upward from the hole of the third ring and engaged with the first ring and a second engaging portion disposed below the first engaging portion and engaged with the third ring; and an actuator configured to raise and lower the lifter.

20 Claims, 10 Drawing Sheets

(56) References Cited

U.S. PATENT DOCUMENTS

| | | | | |
|---|---|---|---|---|
| 2021/0098238 A1* | 4/2021 | Hayashi | ............ | H01J 37/32449 |
| 2022/0301833 A1* | 9/2022 | Hayashi | ............ | H01J 37/32642 |
| 2022/0328290 A1* | 10/2022 | Mishra | .............. | H01J 37/32385 |

FOREIGN PATENT DOCUMENTS

| | | |
|---|---|---|
| JP | 2019-114790 A | 7/2019 |
| JP | 2020-113603 A | 7/2020 |
| JP | 2021-068752 A | 4/2021 |
| WO | 2017/131927 A1 | 8/2017 |

* cited by examiner

SUBSTRATE SUPPORT, PLASMA PROCESSING APPARATUS, AND RING REPLACEMENT METHOD

CROSS-REFERENCE TO RELATED APPLICATIONS

This application claims priority to Japanese Patent Application No. 2021-198257 filed on Dec. 7, 2021, the entire contents of which are incorporated herein by reference.

TECHNICAL FIELD

The present disclosure relates to a substrate support, a plasma processing apparatus, and a ring replacement method.

BACKGROUND

A substrate support of a plasma processing apparatus disclosed in Japanese Laid-open Patent Publication No. 2020-113603 includes a wafer supporting surface, a ring supporting surface, a lifter pin, and a driving mechanism. A wafer is placed on the wafer supporting surface. On the ring supporting surface, a first ring having a first engaging portion, and a second ring having a through-hole extending to a bottom surface of the first engaging portion and having a second engaging portion engaged with the first engaging portion are placed. Further, the ring supporting surface has a hole at a position corresponding to the through-hole, and is disposed on an outer peripheral side of the wafer supporting surface. The lifter pin has a first holding portion that fits into the through-hole, and a second holding portion having a protruding portion connected in an axial direction of the first holding portion and protruding from an outer periphery of the first holding portion. The lifter pin is accommodated in the hole of the ring supporting surface with the first holding portion facing the ring supporting surface. The driving mechanism drives the lifter pin to be raised and lowered.

SUMMARY

The technique of the present disclosure can replace two types of rings disposed on a substrate support using a common lifter.

In accordance with an aspect of the present disclosure, there is a substrate support comprising: a substrate supporting portion; a first ring disposed to surround the substrate supporting portion; a second ring surrounding the first ring without overlapping the first ring in plan view; a third ring disposed below the first ring and the second ring such that an inner portion of the third ring overlaps the first ring in plan view and an outer portion of the third ring overlaps the second ring in plan view, and having a hole at the inner portion of the third ring; a lifter having a first engaging portion protruding upward from the hole of the third ring and engaged with the first ring and a second engaging portion disposed below the first engaging portion and engaged with the third ring; and an actuator configured to raise and lower the lifter.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
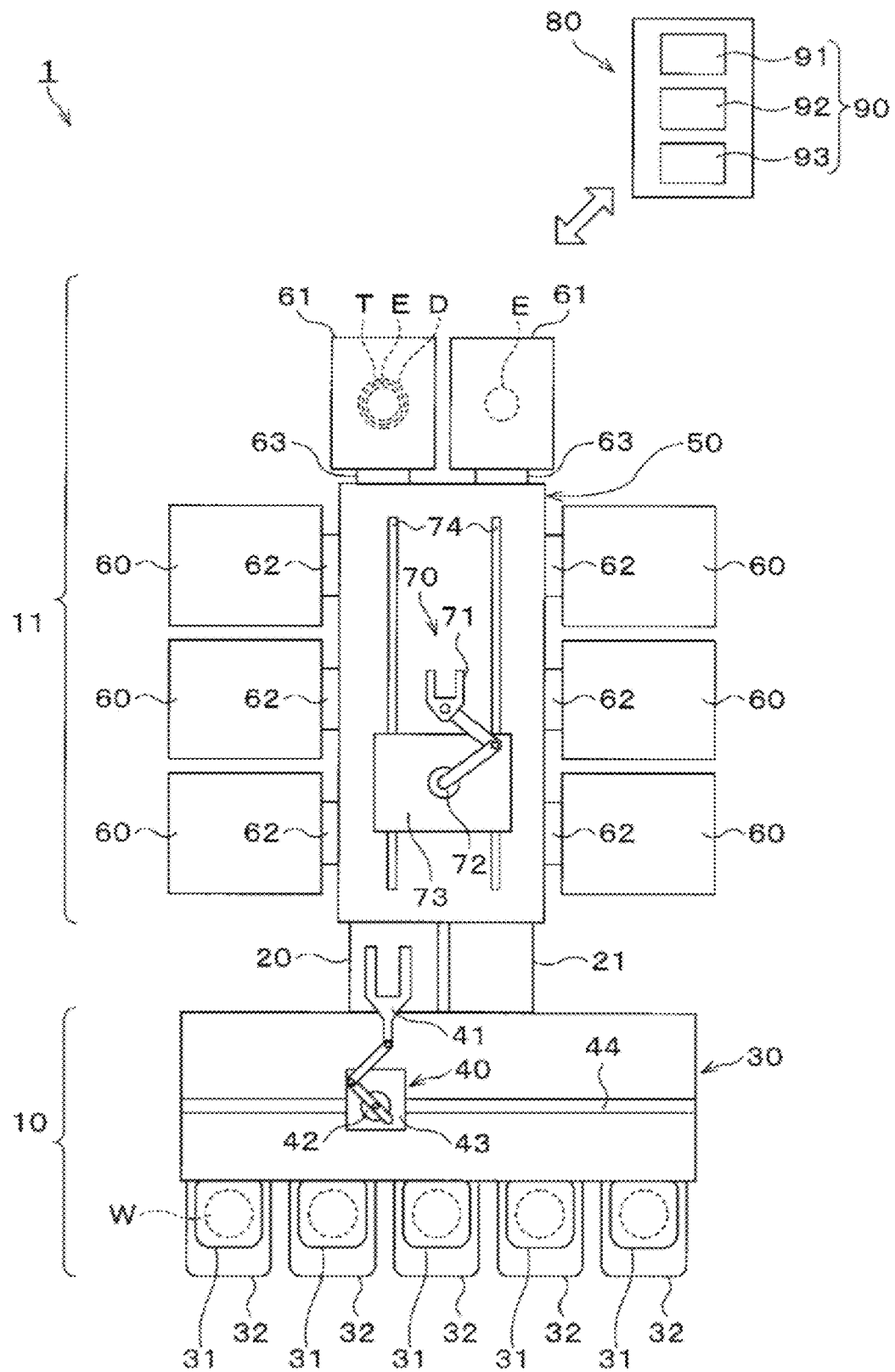
FIG. 1 is a plan view showing a schematic configuration of a plasma processing system having a plasma processing apparatus according to an embodiment.

In a manufacturing process of semiconductor devices and the like, plasma processing such as etching or the like is performed on a substrate such as a semiconductor wafer (hereinafter, referred to as "wafer") using plasma. The plasma processing is performed in a state where a substrate is placed on a substrate support in a depressurized processing chamber.

The substrate support includes a substrate supporting portion on which the substrate is placed, and consumable members that require periodic replacement. The consumable members include, e.g., an edge ring disposed adjacent to the substrate on the substrate support. The edge ring is etched by exposure to plasma, and thus requires replacement. The edge ring is replaced using, e.g., a lifter that moves up and down while supporting the edge ring, and a transfer device that transfers the edge ring.

The substrate support may include, in addition to the edge ring, another ring disposed to cover an outer side surface of the edge ring. Another ring is also etched by exposure to plasma, and thus needs to be replaced periodically. In other words, another ring is considered as a consumable member.

However, if a lifter pin for replacing the edge ring and a lifter pin for replacing another ring are separately provided, the cost increases.

Therefore, the technique of the present disclosure enables two types of rings disposed on the substrate support to be replaced using a common lifter.

Hereinafter, a substrate support, a plasma processing apparatus, and a method for replacing a ring of the substrate support of the present embodiment will be described with reference to the accompanying drawings. Like reference numerals will be given to like parts having substantially the same functional configuration throughout this specification and the drawings, and redundant description thereof will be omitted.

<Plasma Processing System>

FIG. 1 is a plan view showing a schematic configuration of a plasma processing system having a plasma processing apparatus according to an embodiment.

In a plasma processing system 1 of FIG. 1, plasma processing such as etching or the like is performed on a wafer W as a substrate using plasma.

The plasma processing system 1 includes an atmospheric part 10 and a depressurization part 11. The atmosphere part 10 and the depressurization part 11 are integrally connected through load-lock modules 20 and 21. The atmospheric part 10 includes an atmospheric module that performs desired processing on the wafer W under an atmospheric atmosphere. The depressurization part 11 includes a processing module 60 that performs desired processing on the wafer W under a depressurized atmosphere (vacuum atmosphere).

The load-lock modules 20 and 21 connect a loader module 30 included in the atmosphere part 10 and a transfer module 50 included in the depressurization part 11 through gate valves (not shown). The load-lock modules 20 and 21 are configured to hold the wafer W temporarily. Inner atmospheres of the load-lock modules 20 and 21 can be switched between an atmospheric pressure and a depressurized atmosphere.

The atmospheric part 10 includes the loader module 30 having a transfer device 40 to be described later, and a load port 32 on which a front opening unified pod (FOUP) 31 is placed. The FOUP 31 can store a plurality of wafers W. An orienter module (not shown) for adjusting a horizontal direction of the wafer W, a buffer module (not shown) for temporarily storing a plurality of wafers W, and the like may be connected to the loader module 30.

The loader module 30 has a rectangular housing, and an inner atmosphere of the housing is maintained at an atmospheric pressure. A plurality of, for example, five load ports 32 are arranged side by side on one long side surface of the housing of the loader module 30. The load-lock modules 20 and 21 are arranged side by side on the other long side surface of the housing of the loader module 30.

The transfer 30 configured to transfer the wafer W is disposed in the housing of the loader module 30. The transfer device 40 includes a transfer arm 41 for supporting and transferring the wafer W, a rotatable table 42 for rotatably supporting the transfer arm 41, and a base 43 on which the rotatable table 42 is placed. A guide rail 44 extending in the longitudinal direction of the loader module 30 is disposed in the loader module 30. The base 43 is disposed on the guide rail 44, and the transfer device 40 is movable along the guide rail 44.

The depressurization part 11 includes the transfer module 50, a processing module 60 as a plasma processing apparatus, and a storage module 61 as a storage part. The inner atmospheres of the transfer module 50 and the processing module 60 (specifically, inner atmospheres of a depressurization transfer chamber 51 and a plasma processing chamber 100 that will be described later) are maintained in a depressurized atmosphere, and the inner atmosphere of the storage module 61 is also maintained in a depressurized atmosphere. A plurality of, for example, six processing modules 60 are provided for one transfer module 50, and a plurality of, for example, two storage modules 61 are provided for one transfer module 50. The number and arrangement of the processing modules 60 are not limited to those described in the present embodiment, and may be set in any appropriate manners. At least one processing module including a wafer support to be described later may be provided. Further, the number and arrangement of the storage modules 61 are not limited to those described in the present embodiment, and may be set in any appropriate manners. For example, at least one storage module may be provided.

The transfer module 50 is configured to transfer the wafer W. Further, the transfer module 50 is configured to transfer an edge ring E, an outer ring D and a transfer ring T that will be described later.

The transfer module 50 includes a depressurization transfer chamber 51 having a polygonal (quadrangular shape in plan view in the illustrated example) housing in plan view, and the depressurization transfer chamber 51 is connected to the load-lock modules 20 and 21.

The transfer module 50 transfers the wafer W loaded into the load-lock module 20 to one processing module 60, and transfers the wafer W that has been subjected to desired plasma processing in the processing module 60 to the atmospheric part 10 through the load-lock module 21.

Further, the transfer module 50 may collectively transfer the edge ring E, the outer ring D, and the transfer ring T in the storage module 61 to one processing module 60, and collectively unload the edge ring E, the outer ring D, and the transfer ring T in the processing module 60 to the storage module 61.

Further, the transfer module 50 may transfer only the edge ring E in the storage module 61 to one processing module 60 and unload only the edge ring E in the processing module 60 to the storage module 61.

Further, the transfer module 50 may collectively transfer the outer ring D and the transfer ring T in the storage module 61 to one processing module 60, and collectively transfer the outer ring D and the transfer ring T in the processing module 60 to the storage module 61.

The processing module 60 performs desired plasma processing such as etching or the like on the wafer W transferred from the transfer module 50. The processing module 60 is connected to the transfer module 50 through a gate valve 62. A specific configuration of the processing module 60 will be described later.

The storage module 61 stores the edge ring E, the outer ring D, and the transfer ring T. The edge ring E is stored alone in the housing module 61, or is stored while being supported by the transfer ring T supporting the outer ring D. Further, the outer ring D is stored while being supported by the transfer ring T. The transfer ring T is stored while supporting only the outer ring D or both the outer ring D and the edge ring E. A specific configuration of the transfer ring T will be described later.

Further, the storage module 61 is connected to the transfer module 50 through a gate valve 63.

A transfer device 70 is disposed in the depressurization transfer chamber 51 of the transfer module 50. The transfer device 70 is configured to hold and transfer the wafer W. Further, the transfer device 70 is configured to hold and transfer the transfer ring T while supporting the edge ring E and the outer ring D or only the outer ring D. Further, the transfer device 70 is configured to hold and transfer only the edge ring E.

The transfer device 70 includes a transfer arm 71 for holding and transferring the wafer W, and the transfer ring T and the edge ring E in the above-described state, a rotatable table 72 for rotatably supporting the transfer arm 71, and a base 73 on which the rotatable table 72 is placed. A guide rail 74 extending in the longitudinal direction of the transfer module 50 is disposed in the depressurization transfer chamber 51 of the transfer module 50. The base 73 is disposed on the guide rail 74, and the transfer device 70 is movable along the guide rail 74.

In the transfer module 50, the transfer arm 71 loads the wafer W held in the load-lock module 20 into the processing module 60. Further, the transfer arm 71 unloads the wafer W held in the processing module 60 to the load-lock module 21.

Further, in the transfer module 50, the transfer arm 71 may load the transfer ring T supporting the edge ring E and the outer ring D, and the edge ring E or the transfer ring T supporting only the outer ring D in the storage module 61 into the processing module 60. Further, the transfer arm 71 may unload the transfer ring T supporting the edge ring E and the outer ring D, and the outer ring D or the transfer ring T supporting only the edge ring E in the processing module 60 to the storage module 61.

Further, the plasma processing system 1 includes a controller 80. In one embodiment, the controller 80 processes computer-executable instructions that cause the plasma processing system 1 to perform various operations to be described in the present disclosure. The controller 80 may be configured to control individual components of the plasma processing system 1 to perform various processes to be described herein. In one embodiment, the controller 80 may partially or entirely included in the components of the plasma processing system 1. The controller 80 may include a computer 90, for example. The computer 90 may include a central processing unit (CPU) 91, a storage device 92, and a communication interface 93, for example. The CPU 91 may be configured to perform various control operations based on programs stored in the storage device 92. The storage device 92 may include a random access memory (RAM), a read only memory (ROM), a hard disk drive (HDD), a solid state drive (SSD), or a combination thereof. The communication interface 93 may communicate with other components of the plasma processing system 1 through a communication line such as a local area network (LAN) or the like.

<Wafer Processing in Plasma Processing System 1>

Next, wafer processing performed using the plasma processing system 1 configured as described above will be described.

First, a wafer W is taken out from a desired FOUP 31 and loaded into the load-lock module 20 by the transfer device 40. Then, the load-lock module 20 is sealed and depressurized. Thereafter, the inside of the load-lock module 20 and the inside of the transfer module 50 communicate with each other.

Next, the wafer W is held by the transfer device 70 and transferred from the load-lock module 20 to the transfer module 50.

Next, the gate valve 62 is opened, and the wafer W is loaded into a desired processing module 60 by the transfer device 70. Then, the gate valve 62 is closed and desired processing is performed on the wafer W in the processing module 60. The processing performed on the wafer W in this processing module 60 will be described later.

Next, the gate valve 62 is opened, and the wafer W is unloaded from the processing module 60 by the transfer device 70. Next, the gate valve 62 is closed.

Thereafter, the wafer W is loaded into the load-lock module 21 by the transfer device 70. When the wafer W is loaded into the load-lock module 21, the load-lock module 21 is sealed and opened to the atmosphere. Then, the inside of the load-lock module 21 and the inside of the loader module 30 communicate with each other.

Next, the wafer W is held by the transfer device 40, and is returned from the load-lock module 21 to the desired FOUP 31 via the loader module 30 and accommodated therein. Accordingly, a series of wafer processing in the plasma processing system 1 is completed.

<Processing Module 60>

Figure 2:
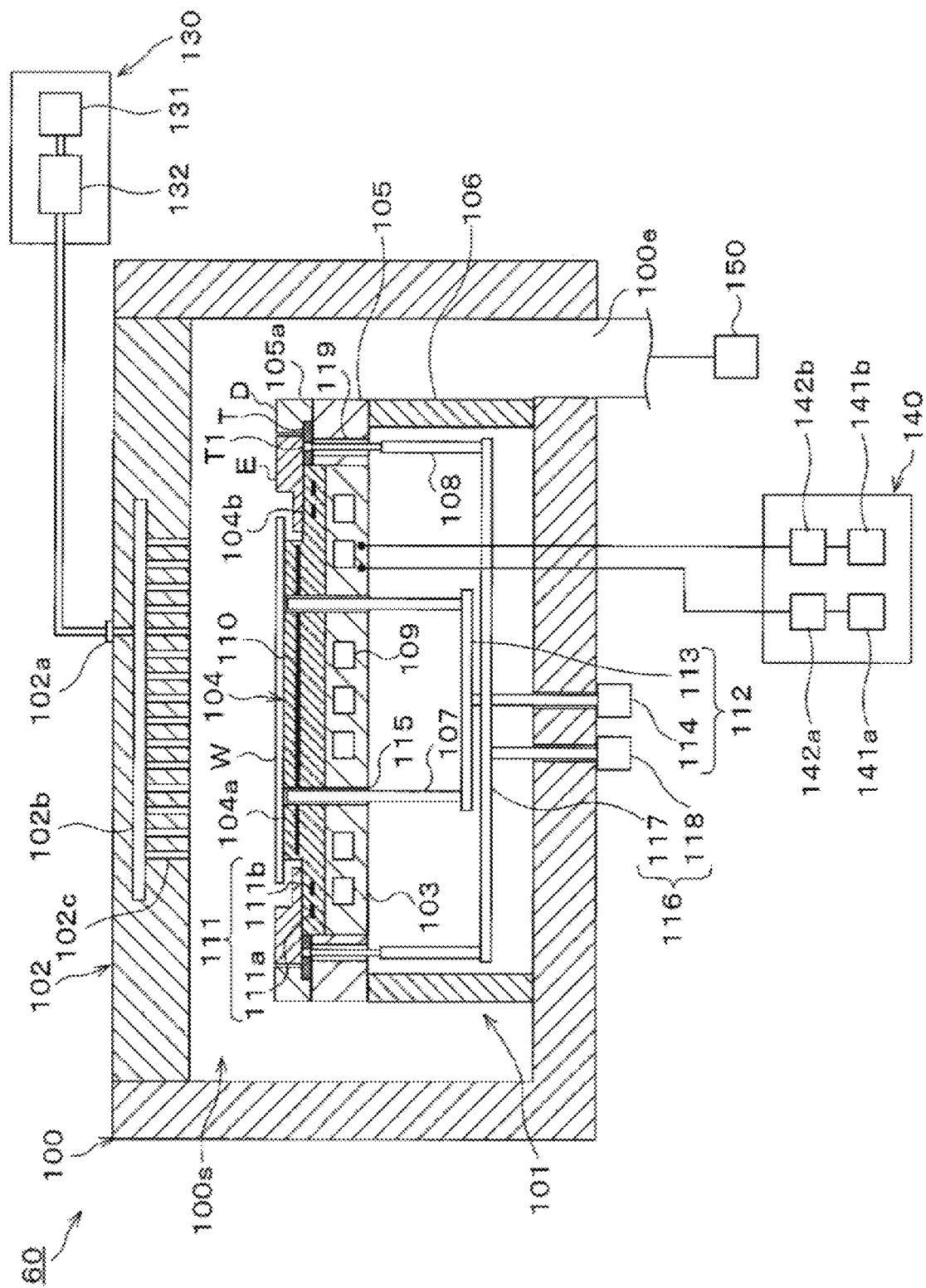
FIG. 2 is a vertical cross-sectional view showing a schematic configuration of a processing module.
Figure 3:
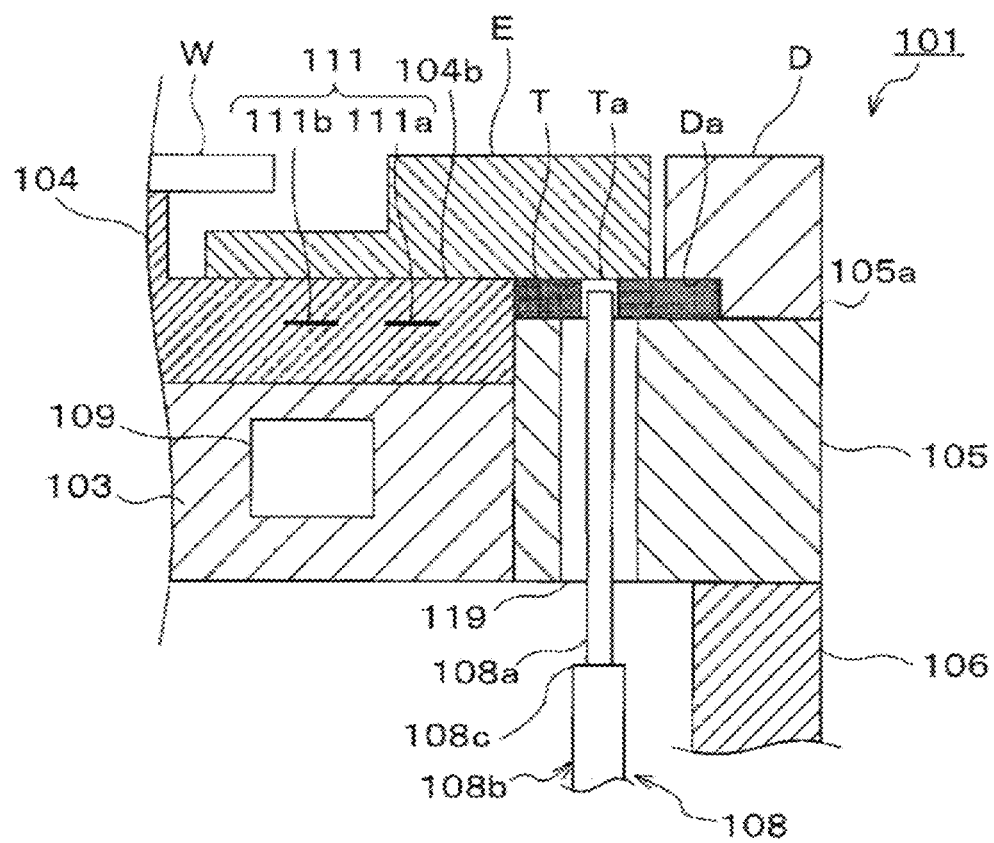
FIG. 3 is a partially enlarged view of FIG. 2.
Figure 4:
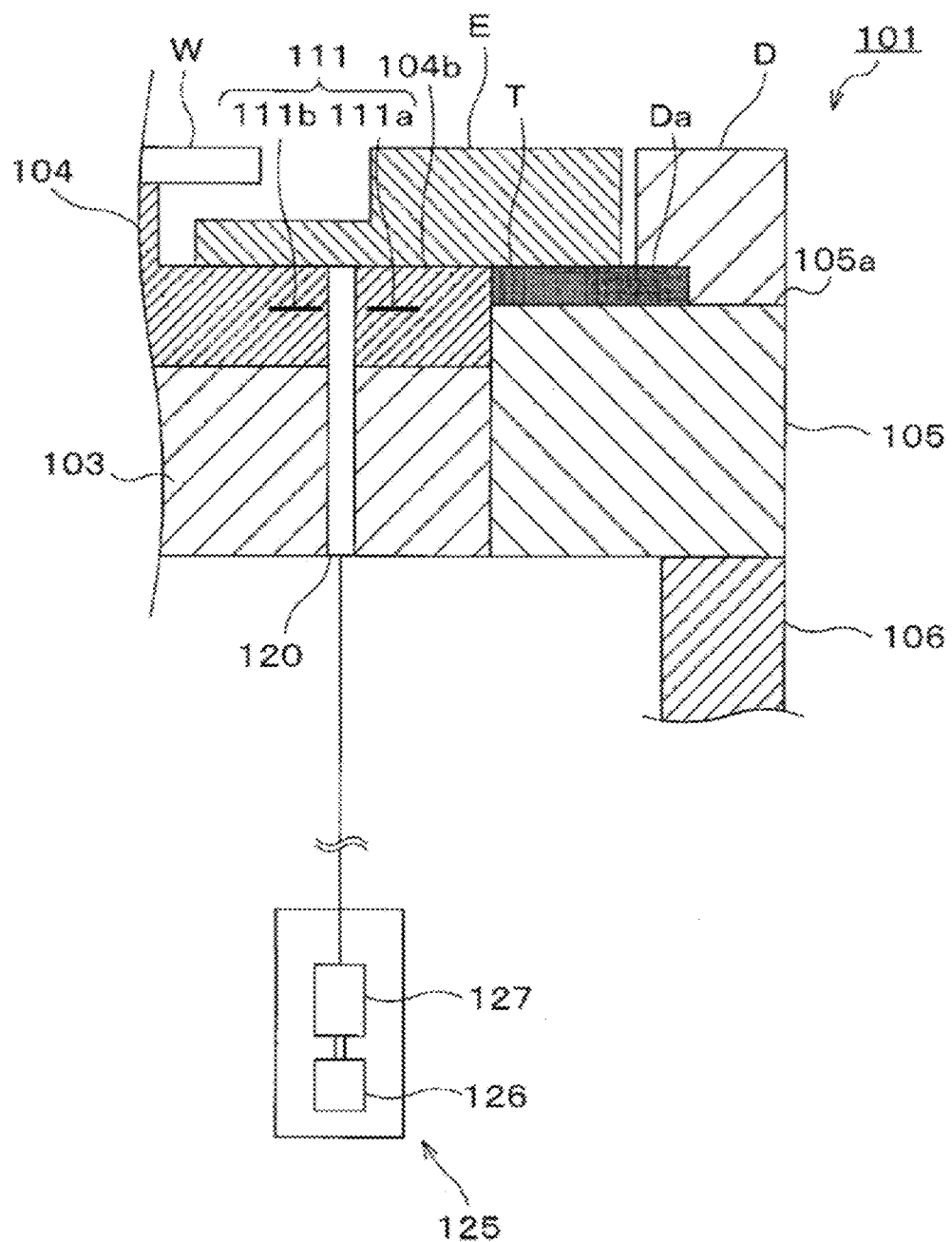
FIG. 4 is an enlarged cross-sectional view of a portion different from that shown in FIG. 2 in a circumferential direction of a wafer support.

Next, the processing module 60 will be described with reference to FIGS. 2 and 3. FIG. 2 is a vertical cross-sectional view showing a schematic configuration of the processing module 60. FIG. 3 is a partially enlarged view of FIG. 2. FIG. 4 is an enlarged cross-sectional view of a portion different from that shown in FIG. 2 in a circumferential direction of a wafer support 101 to be described later.

As shown in FIG. 2, the processing module 60 includes a plasma processing chamber 100 as a processing container, a gas supply part 130, a radio frequency (RF) power supply 140, and an exhaust system 150. The processing module 60 further includes a gas supply part 125 (see FIG. 4). The processing module 60 further includes the wafer support 101 serving as the substrate support, and an upper electrode 102.

The wafer support 101 is disposed in a lower region of a plasma processing space 100s in the plasma processing chamber 100 that can be depressurized. An upper electrode 102 is disposed above the wafer support 101, and may serve as a part of a ceiling of the plasma processing chamber 100.

The wafer support 101 is configured to support the wafer W in the plasma processing space 100s. In one embodiment, the wafer support 101 includes a lower electrode 103, an electrostatic chuck 104, a support 105, an insulator 106, lifters 107 and 108, the edge ring E, the outer ring D, and the transfer ring T.

The lower electrode 103 is made of a conductive material such as aluminum or the like. In one embodiment, a flow path 109 for a temperature control fluid is formed in the lower electrode 103. A temperature control fluid is supplied to the flow path 109 from a chiller unit (not shown) disposed outside the plasma processing chamber 100. The temperature control fluid supplied to the flow path 109 is returned to the chiller unit. By circulating the temperature control fluid, e.g., a low-temperature brine, in the flow path 109, the wafer support 101, the wafer W placed on the wafer support 101, and the edge ring E or the outer ring D can be cooled to a predetermined temperature. By circulating the temperature control fluid, e.g., a high-temperature brine in the flow path 109, the wafer support 101, the wafer W placed on the wafer support 101, and the edge ring E or the outer ring D can be heated to a predetermined temperature.

When the wafer support 101 is provided with a temperature control mechanism, the temperature control mechanism is not limited to the flow path 109, and may be, e.g., a resistance heater, or the like. Further, in the wafer support 101, the temperature control mechanism is not necessarily disposed at the lower electrode 103, and may be disposed at another member.

The electrostatic chuck 104 is disposed on the lower electrode 103. The wafer W is placed on the electrostatic chuck 104. In one embodiment, the central portion of the electrostatic chuck 104 serves as a substrate supporting portion. In one embodiment, the edge ring E is also placed on the electrostatic chuck 104. The electrostatic chuck 104 may attract and hold both the wafer W and the edge ring E using an electrostatic force. In one embodiment, the electrostatic chuck 104 is formed such that the upper surface of the central portion is higher than the upper surface of the peripheral portion. The wafer W is placed on an upper surface 104a of the central portion of the electrostatic chuck 104. The edge ring E is placed on an upper surface 104b of the peripheral portion of the electrostatic chuck 104.

The edge ring E is disposed to surround the central portion (specifically, the outer circumference of the central portion) of the electrostatic chuck 104. In other words, the edge ring E is disposed to surround the wafer W placed on the electrostatic chuck 104 (specifically, placed on the upper surface 104a of the central portion of the electrostatic chuck 104). The edge ring E is an example of "first ring" of the present disclosure, and has a ring shape, more specifically, an annular ring shape in plan view. The edge ring E is made of a conductive material such as Si, $SiO_2$, or the like.

The outer ring D covers the outer side surface of the edge ring E. In other words, the outer ring D is disposed to surround the edge ring E (specifically, the outer circumference of the edge ring E). Further, the outer ring D is an example of "second ring" of the present disclosure, and has a ring shape, more specifically, an annular ring shape in plan view.

The outer ring D is made of a conductive material such as Si, SiC, or the like. The edge ring E and the outer ring D may be made of the same material, or may be made of different materials.

The outer ring D is disposed so as not to overlap the edge ring E in plan view. Specifically, the outer ring D is formed so as not to overlap the edge ring E in plan view when it is concentric with the edge ring E. More specifically, the outer ring D is formed such that the diameter of the innermost circumference of the outer ring D is greater than the diameter of the outermost circumference of the edge ring E, for example.

The outer ring D on the wafer support 101 is replaced using the transfer ring T. The transfer ring T may also be used to replace the edge ring E.

The transfer ring T is disposed below the edge ring E and the outer ring D such that an inner portion thereof overlaps the edge ring E and an outer portion thereof overlaps the outer ring D in plan view. Further, the transfer ring T is an example of "third ring" and "inner ring" of the present disclosure, and has a ring shape, more specifically, an annular ring shape in plan view. For example, the transfer ring T is formed such that the diameter of the innermost circumference of the transfer ring T is smaller than the diameter of the outermost circumference of the edge ring E, and the diameter of the outermost circumference of the transfer ring T is greater than the diameter of the innermost circumference of the outer ring D.

The transfer ring T is made of an insulating material such as $SiO_2$, ceramic (e.g., $Al_2O_3$), or the like. Further, the transfer ring T may be made of a conductive material such as Si or SiC, which has a higher electrical resistivity compared to that of the edge ring E, that is, a conductive material such as Si, SiC, or the like, of which impurity concentration has been adjusted to increase the electrical resistivity compared to the material of the edge ring E.

Further, the transfer ring T has holes Ta through which the lifters 108 are inserted at positions corresponding to the lifters 108. The holes Ta are formed in the inner peripheral portion of the transfer ring T overlapping the outer peripheral portion of the edge ring E in plan view to penetrate through the transfer ring T.

In one embodiment, as shown in FIG. 3, a recess Da that is recessed in a radially outward direction of the outer ring D is formed at the innermost peripheral portion of the outer ring D along the entire circumference of the outer ring D. The transfer ring T is formed to fit into the recess Da of the outer ring D.

As shown in FIG. 2, an electrode 110 for electrostatically attracting and holding the wafer W is formed at the central portion of the electrostatic chuck 104. An electrode 111 for electrostatically attracting and holding the edge ring E may be disposed at the peripheral portion of the electrostatic chuck 104. Specifically, the electrode 111 is disposed at a portion that overlaps the edge ring E but does not overlap the transfer ring T in plan view. The electrostatic chuck 104 has a configuration in which electrodes 110 and 111 are embedded in an insulating member made of an insulating material, for example.

A DC voltage is applied to the electrode 110 from a DC power supply (not shown). Accordingly, an electrostatic force is generated, and the wafer W is attracted and held on the upper surface 104a of the central portion of the electrostatic chuck 104. Similarly, a DC voltage is applied to the electrode 111 from the DC power supply (not shown). Accordingly, an electrostatic force is generated, and the edge ring E is attracted and held on the upper surface 104b of the peripheral portion of the electrostatic chuck 104. The electrode 111 is a bipolar electrode 111 including a pair of electrodes 111a and 111b.

In the present embodiment, the central portion of the electrostatic chuck 104 where the electrode 110 is disposed and the peripheral portion of the electrostatic chuck 104 where the electrode 111 is disposed are integrated. However, the central portion and the peripheral portion thereof may be separated.

Further, in the present embodiment, the electrode 111 for attracting and holding the edge ring E is a bipolar electrode. However, the electrode 111 may be a unipolar electrode 111.

Further, the central portion of the electrostatic chuck 104 is formed to have a diameter smaller than the diameter of the wafer W, for example. When the wafer W is placed on the upper surface 104a of the central portion of the electrostatic chuck 104, the peripheral portion of the wafer W protrudes from the central portion of the electrostatic chuck 104.

The edge ring E has a stepped portion at an upper portion thereof, so that the upper surface of the outer peripheral portion is higher than the upper surface of the inner peripheral portion. The inner peripheral portion of the edge ring E is positioned under the peripheral portion of the wafer W protruding from the central portion of the electrostatic chuck 104. In other words, the inner diameter of the edge ring E is smaller than the outer diameter of the wafer W.

The support 105 is made of an insulating material such as quartz or the like, for example, and has a ring shape in plan view. The support 105 supports the lower electrode 103 and the electrostatic chuck 104. In one embodiment, the outer ring D and the transfer ring T are placed on the support 105.

The upper surface 104a of the central portion of the electrostatic chuck 104 serves as a substrate supporting surface on which the wafer W is placed. An upper surface 105a of the support 105 serves as a ring supporting surface on which the outer ring D and the transfer ring T are placed, and the upper surface 104b of the peripheral portion of the electrostatic chuck 104 serves as another ring supporting surface disposed between the substrate supporting portion and the ring supporting surface and on which the edge ring E is placed.

The insulator 106 is a cylindrical member made of ceramic or the like, and supports the support 105. The insulator 106 has the same outer diameter as that of the support 105, and supports the peripheral portion of the support 105.

The lifters 107 are raised and lowered with respect to the upper surface 104a of the central portion of the electrostatic chuck 104. The lifters 107 are formed in a columnar shape and made of ceramic, for example. When the lifters 107 are raised, the upper ends of the lifters 107 protrude from the upper surface 104a to support the wafer W. The lifters 107 can transfer the wafer W between the wafer support 101 and the transfer arm 71 of the transfer device 70.

Three or more lifters 107 are spaced apart from each other at intervals, and extend in the vertical direction.

The lifters 107 are raised and lowered by an actuator 112. The actuator 112 includes a support member 113 for supporting the lifters 107, and a driving part 114 for generating a driving force for raising and lowering the support member 113 to raise and lower the lifters 107. The driving part 114 has a motor (not shown), for example, as a driving source for generating the driving force.

The lifters 107 are inserted into insertion holes 115 whose upper ends are opened toward the upper surface 104a of the central portion of the electrostatic chuck 104. The insertion holes 115 are formed to extend downward from the upper surface 104a of the central portion of the electrostatic chuck 104 to the bottom surface of the lower electrode 103, for example.

The lifters 108 are elevating members that are raised and lowered with respect to the upper surface 105a of the support 105 serving as the ring supporting surface, and are formed in a columnar shape and made of ceramic, for example. The lifters 108 are configured such that the upper ends thereof can protrude from the upper surface 105a of the support 105 when they are raised. Specifically, the lifters 108 are configured to protrude from the upper surface 105a of the inner peripheral portion of the support 105 at positions overlapping the edge ring E and the transfer ring T in plan view.

Three or more lifters 108 are spaced apart from each other at intervals in the circumferential direction of the electrostatic chuck 104, and extend vertically.

The lifters 108 are raised and lowered by an actuator 116. The actuator 116 includes, e.g., a support member 117 for supporting the lifters 108, and a driving part 118 for generating a driving force for raising and lowering the support member 117 to raise and lower the lifters 107.

The driving part 118 has, e.g., a motor (not shown) as a driving source for generating the driving force.

The lifters 108 are inserted into insertion holes 119 whose upper ends are opened toward the upper surface 105a of the support 105 that supports the outer ring D and the transfer ring T. The insertion holes 119 are formed in the inner peripheral portion of the support 105 to penetrate through the support 105.

As shown in FIG. 3, each lifter 108 has a first engaging portion 108a and a second engaging portion 108b.

The first engaging portion 108a forms the upper portion of the lifter 108, and protrudes upward from the hole Ta of the transfer ring T to be engaged with the edge ring E. The first engaging portion 108a is configured to pass through the hole Ta of the transfer ring T to be in contact with the bottom surface of the edge ring E when the lifter 108 is raised, thereby supporting the edge ring E from the bottom surface thereof.

The second engaging portion 108b is disposed below the first engaging portion 108a, and is engaged with the transfer ring T. Specifically, the second engaging portion 108b is in contact with the bottom surface of the transfer ring T without passing through the hole Ta of the transfer ring T, thereby supporting the transfer ring T from the bottom surface thereof.

Further, the second engaging portion 108b is connected to the lower portion of the first engaging portion 108a along the axial direction of the lifter 108. Further, the second engaging portion 108b has a projecting portion 108c projecting outward from the outer periphery of the first engaging portion 108a at a position connected to the first engaging portion 108a.

The specific shapes of the first engaging portion 108a, the second engaging portion 108b, and the projecting portion 108c are not particularly limited. For example, the first engaging portion 108a, the second engaging portion 108b, and the protruding portion 108c may be cylindrical members that are coaxial with each other.

The above-described actuator 116 raises and lowers the lifters 108 whose second engaging portions 108b are engaged with the transfer ring T, thereby raising and lowering the outer ring D engaged with the transfer ring T.

Further, the actuator 116 raises and lowers the lifters 108 whose first engaging portions 108a are engaged with the edge ring E, thereby raising and lowering the edge ring E.

A gas supply hole(s) (not shown) is formed in the upper surface 104a of the central portion of the electrostatic chuck 104 to supply a heat transfer gas to the backside of the wafer W placed on the upper surface 104a. The heat transfer gas is supplied from a gas supply part (not shown) through the gas supply hole(s). A gas supply part may include one or more gas sources and one or more pressure controllers. In one embodiment, the gas supply part is configured to supply a heat transfer gas from the gas source(s) to the gas supply hole(s) through the pressure controller(s), for example.

Further, as shown in FIG. 4, a heat transfer gas supply line 120 is formed in the upper surface 104b of the peripheral portion of the electrostatic chuck 104. The heat transfer gas supply line 120 supplies a heat transfer gas such as helium gas or the like to the bottom surface of the edge ring E placed on the upper surface 104b. The heat transfer gas supply line 120 is in fluidic communication with the upper surface 104b. Further, the end portion of the heat transfer gas supply line 120 opposite to the end portion facing the upper surface 104b is in fluidic communication with the gas supply part 125. The gas supply part 125 may include one or more gas sources 126 and one or more flow rate controllers 127. In one embodiment, the gas supply part 125 is configured to supply a heat transfer gas from the corresponding gas source 126 through the corresponding flow rate controller 127 to the heat transfer gas supply line, for example. The flow rate controllers 127 may include, e.g., a mass flow controller or a pressure-controlled flow controller.

As shown in FIG. 2, the upper electrode 102 also functions as a shower head for supplying one or more processing gases from the gas supply part 130 to the plasma processing space 100s. In one embodiment, the upper electrode 102 has a gas inlet 102a, a gas diffusion space 102b, and a plurality of gas outlets 102c. The gas inlet 102a is in fluidic communication with the gas supply part 130 and the gas diffusion space 102b, for example. The gas outlets 102c are in fluidic communication with the gas diffusion space 102b and the plasma processing space 100s. In one embodiment, the upper electrode 102 is configured to supply one or more processing gases from the gas inlet 102a to the plasma processing space 100s through the gas diffusion space 102b and the gas outlets 102c.

The gas supply part 130 may include one or more gas sources 131 and one or more flow rate controllers 132. In one embodiment, the gas supply part 130 is configured to supply one or more processing gases from the corresponding gas sources 131 to the gas inlet 102a through the corresponding flow rate controllers 132, for example. The flow rate controllers 132 may include, e.g., a mass flow controller or a pressure-controlled flow controller. Further, the gas supply part 130 may include one or more flow modulation devices for modulating the gas flow of one or more processing gases or causing it to pulsate.

The RF power supply 140 is configured to supply an RF power, e.g., one or more RF signals, to one or more electrodes such as the lower electrode 103 or the upper electrode 102, or both the lower electrode 103 and the upper electrode 102. Therefore, plasma is produced from one or more processing gases supplied to the plasma processing space 100s. Accordingly, the RF power supply 140 can function as at least a part of a plasma generator configured to generate plasma from one or more processing gases in the plasma processing chamber. The RF power supply 140 includes, e.g., two RF generators 141a and 141b and two matching circuits 142a and 142b. In one embodiment, the RF power supply 140 is configured to supply a first RF signal from the first RF generator 141a to the lower electrode 103 through the first matching circuit 142a. For example, the frequency of the first RF signal may be within a range of 27 MHz to 100 MHz.

Further, in one embodiment, the RF power supply 140 is configured to supply a second RF signal from the second RF generator 141b to the lower electrode 103 through the second matching circuit 142b. For example, the frequency of the second RF signal may be within a range of 400 kHz to 13.56 MHz. Alternatively, a DC (Direct Current) pulse generator may be used instead of the second RF generator 141b.

Although it is not illustrated, other embodiments of the present disclosure may be considered. For example, in an alternative embodiment, the RF power supply 140 may be configured to supply the first RF signal to the lower electrode 103 and supply the second RF signal from another RF generator to the lower electrode 103, and supply a third RF signal from still another RF generator to the lower electrode 103. In another alternative embodiment, a DC voltage may be applied to the upper electrode 102.

Further, in various embodiments, amplitudes of one or more RF signals (i.e., first RF power, second RF power, and the like) may pulsate or be modulated. The amplitude modulation may include causing the RF signal amplitude to pulsate between ON and OFF states or between multiple different ON states.

The exhaust system 150 is connected to, for example, an exhaust port 100e disposed at a bottom portion of the chamber 100. The exhaust system 125 may include a pressure pump and a vacuum pump. The vacuum pump may include a turbo molecular pump, a roughing vacuum pump, or a combination thereof.

<Wafer Processing in Processing Module 60>

Next, an example of wafer processing performed using the processing module 60 will be described. In the processing module 60, the wafer W is subjected to processing such as etching or the like.

First, the wafer W is loaded into the plasma processing chamber 100 by the transfer device 70 and placed on the electrostatic chuck 104 by vertically moving the lifters 107. Then, the wafer W is electrostatically attracted and held on the electrostatic chuck 104 by an electrostatic force generated by applying a DC voltage to the electrode 110 of the electrostatic chuck 104. After the wafer W is loaded, the plasma processing chamber 100 is depressurized to a predetermined vacuum level by the exhaust system 150.

Next, the processing gas is supplied from the gas supply part 130 to the plasma processing space 100s through the upper electrode 102. Further, an RF power for plasma generation HF is supplied from the RF power supply 140 to the lower electrode 103. Accordingly, the processing gas is excited and plasma is produced. At this time, an RF power for ion attraction LF may be supplied from the RF power supply 140. Then, the wafer W is subjected to the plasma processing by the action of the generated plasma.

During the plasma processing, a DC voltage is applied to the electrode 111 of the electrostatic chuck 104, so that an electrostatic force is generated and the edge ring E is electrostatically attracted and held on the electrostatic chuck 104. Further, during the plasma processing, a heat transfer gas is supplied to the backside of the wafer W and the bottom surface of the edge ring E attracted and held on the electrostatic chuck 104 through the heat transfer gas supply line 120 or the like.

In order to end the plasma processing, the supply of the RF power HF from the RF power supply 140 and the supply of the processing gas by the gas supply part 130 are stopped. When the RF power LF is supplied during the plasma processing, the supply of the RF power LF is also stopped. Next, the attraction and holding of the wafer W on the electrostatic chuck 104 is released. Further, the supply of the heat transfer gas to the backside of the wafer W may be stopped.

Then, the wafer W is raised by the lifters 107 and separated from the electrostatic chuck 104. At this time, an antistatic treatment of the wafer W may be performed. Then, the transfer device 70 unloads the wafer W from the plasma processing chamber 100, and a series of wafer processing is ended.

<Operation and Effect of Outer Ring D and Reason for Providing Transfer Ring T>

In the processing module 60, the outer ring D is made of a conductive material. Therefore, unlike the case where the outer ring D is made of an insulating material, a sheath is formed above the outer ring D during plasma processing. Therefore, the following effects are obtained.

(1) Since reaction by-products are less likely to adhere to the outer ring D due to the sheath, the influence of particles caused by the reaction by-products adhered to the outer ring D on the wafer W can be suppressed.

(2) Since the consumption of the outer ring D is reduced due to the sheath, the lifetime of the outer ring D can increase.

(3) Since the consumption of the outer ring D is reduced, a decrease in the etching rate of the peripheral portion of the wafer W due to the consumption of the outer ring D can be suppressed.

However, both the outer ring D and the edge ring E are consumed, and thus require replacement. The outer ring D and the edge ring E have different consumption amounts, so that it is preferable to separately replace the outer ring D and the edge ring E. However, when the lifters 108 are separately provided to replace the outer ring D and the edge ring E, the cost increase. In order to avoid the cost increase, it is preferable to use the common lifters 108 for the rings.

Further, since the outer ring D made of a conductive material is in an electrically floating state during plasma processing, a potential difference occurs between the outer ring D and the edge ring E that is also made of a conductive material by the influence of the plasma. Therefore, if the gap between the outer ring D and the edge ring E is small, abnormal discharge may occur when the potential difference increases. Further, when the outer ring D and the edge ring E are arranged to overlap in plan view, it is difficult to obtain a large gap (e.g., 2 mm or more) therebetween.

Hence, in the present embodiment, the outer ring D and the edge ring E do not overlap in plan view, and a relatively large gap (e.g., 0.1 mm to 3 mm at room temperature, more preferably 0.2 mm to 2.5 mm) is obtained between the outer peripheral portion of the outer ring D and the inner peripheral portion of the edge ring E.

Further, if the outer ring D and the edge ring E are arranged as described above, it is not possible to replace both the outer ring D and the edge ring E using the common lifters 108.

Therefore, the transfer ring T configured to support both the outer ring D and the edge ring E, and the lifters 108 having the first engaging portion 108a engaged with the edge ring E and the second engaging portion 108b engaged with the transfer ring T supporting the outer ring D are used. Hereinafter, the replacement of the edge ring E and the outer ring D using the transfer ring T and the lifters 108 will be described.

<Replacement>

Figure 5:
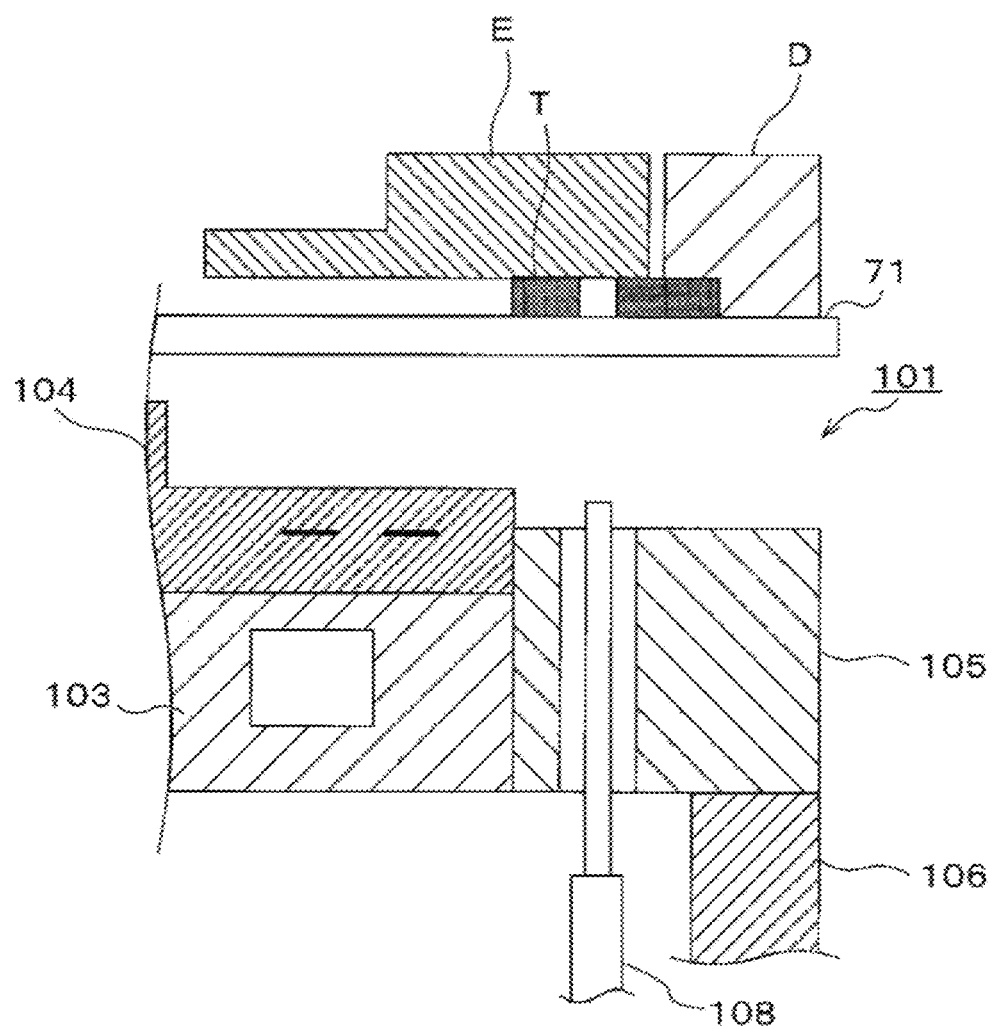
FIGS. 5 to 7 illustrate the state of the vicinity of the wafer support during installation of both an edge ring and an outer ring.
Figure 6:
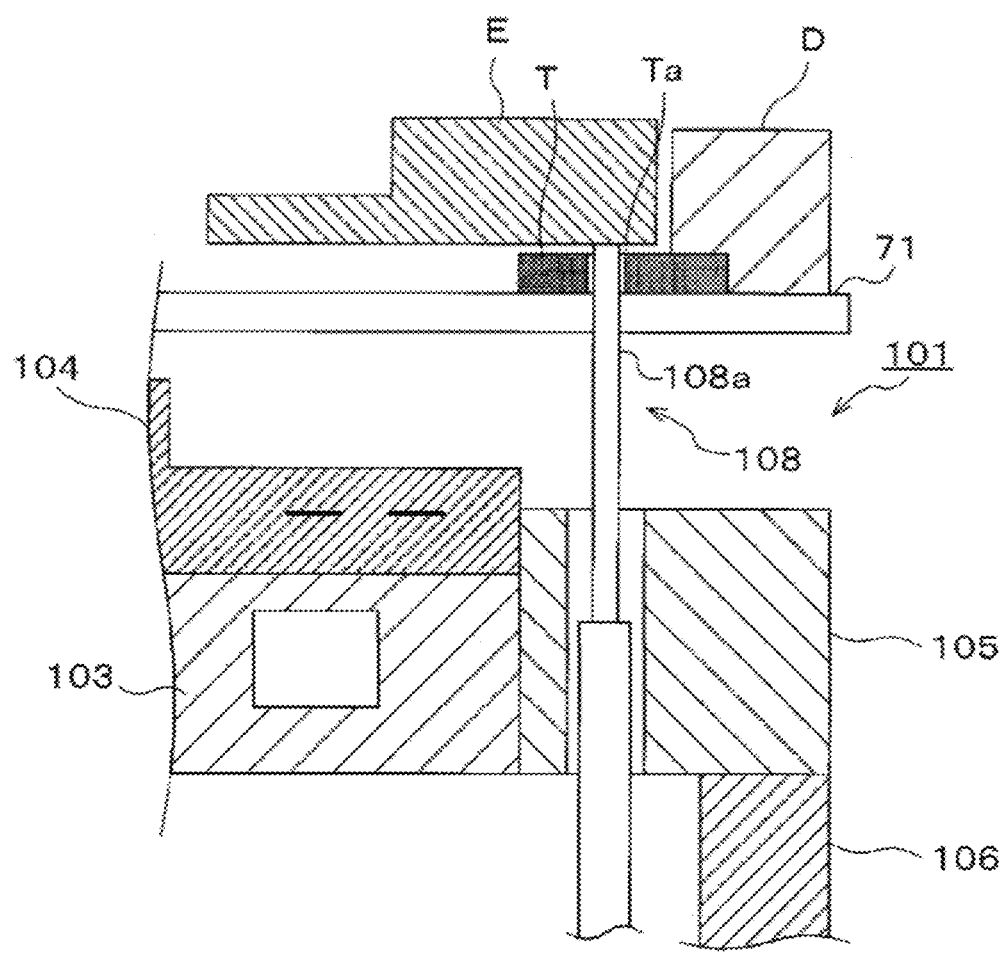
Figure 7:
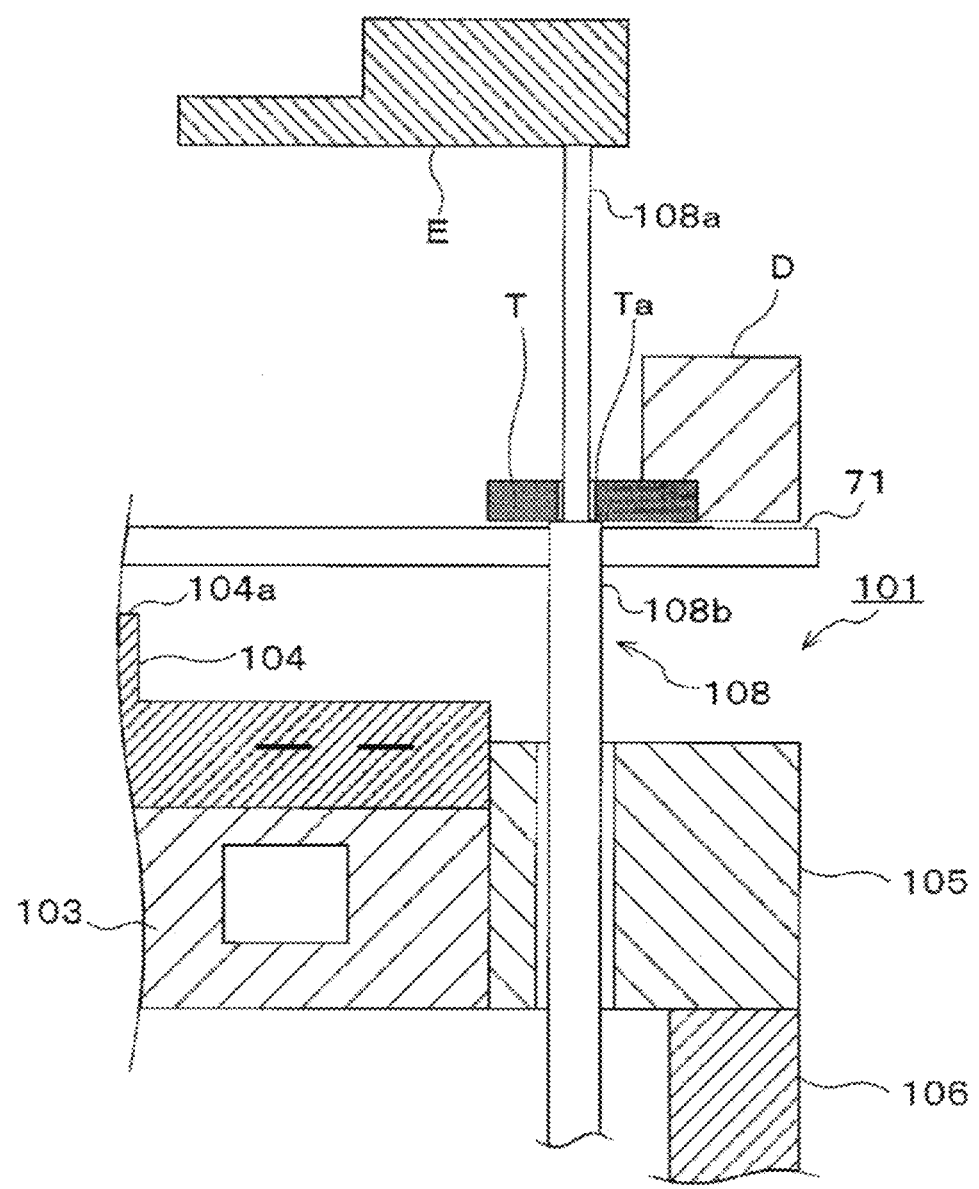

First, an example of a process of simultaneously installing the edge ring E and the outer ring D of the wafer support 101 in the plasma processing system 1 will be described with reference to FIGS. 5 to 7. FIG. 5 to 7 show the state of the vicinity of the wafer support 101 during the above process. The following processes are performed under the control of the controller 80.

(Step S1: Loading)

First, the transfer ring T supporting the edge ring E and the outer ring D in the storage module 61 is loaded into the plasma processing chamber 100 of the processing module 60 where the edge ring E and the outer ring D will be installed by the transfer device 70.

Specifically, the transfer ring T in the storage module 61 is held by the transfer arm 71 of the transfer device 70. Next, the transfer arm 71 holding the transfer ring T is inserted into the plasma processing chamber 100 of the processing module 60 where the edge ring E and the outer ring D will be installed through a loading/unloading port (not shown). At this time, the plasma processing chamber 100 may be in a depressurized state. Then, as shown in FIG. 5, the transfer ring T is transferred by the carrier arm 71 to a position above the upper surface 104b of the peripheral portion of the electrostatic chuck 104 and the upper surface 105a of the support 105.

(Step S2: Placing)

Next, the edge ring E and the outer ring D are placed on the electrostatic chuck 104 and the support 105 from the transfer device 70.

Specifically, all the lifters 108 are raised, and the edge ring E is transferred from the transfer ring T supported by the transfer arm 71 to the first engaging portions 108a of the lifters 108 that have passed through the holes Ta of the transfer ring T as shown in FIG. 6. Then, the raising of all the lifers 108 is continued, and the transfer ring T supporting the outer ring D is transferred from the transfer arm 71 to the second engaging portions 108b of the lifters 108 as shown in FIG. 7. At this time, the lifters 108 are raised until the top portions of the second engaging portions 108b reach a first predetermined height. The first predetermined height is the height at which the transfer arm 71 does not interfere with the outer ring D, the transfer ring T, or the like when the transfer arm 71 is inserted into or removed from the gap between the upper surface 104a of the central portion of the electrostatic chuck 104 and the transfer ring T supported by the second engaging portion 108b and the outer ring D supported by the transfer ring T.

Then, the transfer arm 71 is withdrawn from the plasma processing chamber 100. Further, the lifters 108 are lowered. Accordingly, the edge ring E, the outer ring D, and the transfer ring T are placed on the upper surface 104b of the peripheral portion of the electrostatic chuck 104 and the upper surface 105a of the support 105. Specifically, first, the transfer ring T and the outer ring D are placed on the upper surface 105a of the support 105 and, then, the edge ring E is placed on the upper surface 104b of the peripheral portion of the electrostatic chuck 104. In other words, the edge ring E is placed on the upper surface 104b (i.e., another ring supporting surface) of the peripheral portion of the electrostatic chuck 104 in a state where the transfer ring T and the outer ring D are placed on the upper surface 105 (i.e., the ring supporting surface) of the support 105.

In this manner, a series of processes for simultaneously installing the edge ring E and the outer ring D is ended.

After the edge ring E is placed, the edge ring E may be attracted and held on the electrostatic chuck 104 by an electrostatic force generated by applying a DC voltage from a DC power supply (not shown) to the electrode 111 of the electrostatic chuck 104.

In one embodiment, after the edge ring E is placed, a small gap exists between the bottom surface of the edge ring E and the upper surface of the transfer ring T so that the edge ring E can be appropriately placed on the electrostatic chuck 104.

Next, an example of a process of simultaneously removing the edge ring E and the outer ring D of the wafer support 101 in the plasma processing system 1 will be described.

(Step S11: Transferring Edge Ring E and Outer Ring D)

First, the edge ring E and the outer ring D are transferred from the electrostatic chuck 104 to the lifters 108.

Specifically, first, when a DC voltage is applied to the electrode 111, the application of the DC voltage is stopped, and the attraction and holding of the edge ring E on the electrostatic chuck 104 is released.

Next, all the lifters 108 are raised, and the edge ring E is transferred from the upper surface 104b of the peripheral portion of the electrostatic chuck 104 to the first engaging portions 108a of the lifters 108 that have passed through the insertion holes 119 and the hole Ta of the transfer ring T (see FIG. 8 to be described later). Thereafter, the raising of all the lifters 108 is continued, and the transfer ring T supporting the outer ring D is transferred from the upper surface 105a of the support 105 to the second engaging portions 108b of the lifters 108. At this time, the lifters 108 are raised until the top portions of the second engaging portions 108b reach the above-described first predetermined height.

(Step S12: Unloading)

Next, the edge ring E and the outer ring D are unloaded from the plasma processing chamber 100 of the processing module 60.

Specifically, the transfer arm 71 is inserted into the depressurized plasma processing chamber 100 through a loading/unloading port (not shown). Then, as shown in FIG. 7, the transfer arm 71 passes through the gap between the upper surface 104a of the central portion of the electrostatic chuck 104 and the transfer ring T supported by the second engaging portions 108b of the lifters 108 and the outer ring D supported by the transfer ring T.

Next, all the lifters 108 are lowered, and the transfer ring T supporting the outer ring D is transferred from the second engaging portions 108b of the lifters 108 to the transfer arm 71, as shown in FIG. 6. Then, the lowering of all the lifters 108 is continued, and the edge ring E is transferred from the first engaging portions 108a of the lifters 108 to the transfer ring T supported by the transfer arm 71, as shown in FIG. 5.

Thereafter, the transfer arm 71 is withdrawn from the plasma processing chamber 100, and the transfer ring T supporting the outer ring D and the edge ring E is unloaded from the processing module 60. The unloaded transfer ring T supporting the outer ring D and edge ring E is loaded into the storage module 61.

In this manner, a series of processes for simultaneously removing the edge ring E and the outer ring D is ended.

Next, an example of a process of removing only the edge ring E will be described with reference to FIG. 8. FIG. 8 shows the state of the vicinity of the wafer support 101 during the above process.

(Step S21: Transferring Edge Ring E)

First, the edge ring E is transferred from the electrostatic chuck 104 to the lifters 108.

Specifically, first, when a DC voltage is applied to the electrode 111, the application of the DC voltage is stopped, and the attraction and holding of the edge ring E on the electrostatic chuck 104 is released.

Figure 8:
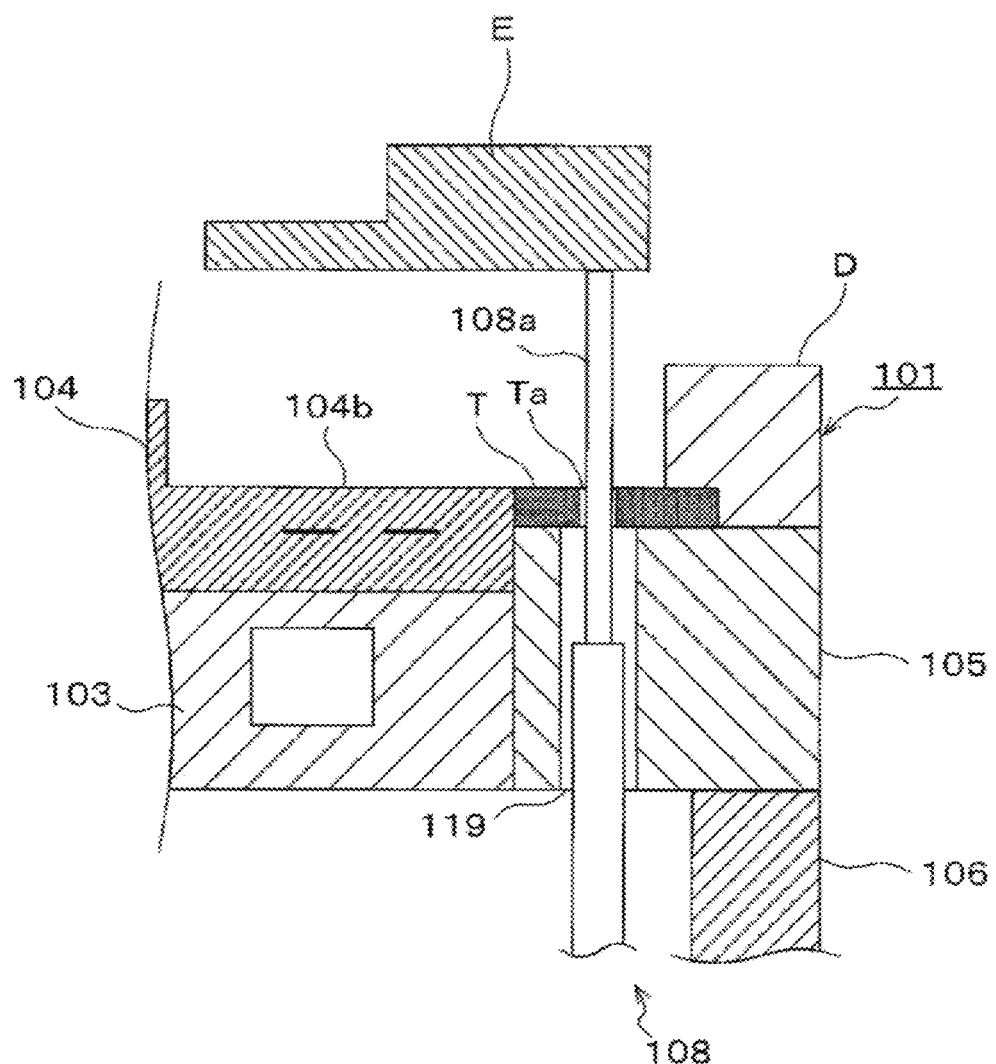
FIG. 8 shows the state of the vicinity of the wafer support during installation of only the edge ring.

Next, all the lifters 108 are raised, and the edge ring E is transferred to the first engaging portions 108a of the lifters 108 that have passed through the insertion holes 119 and the holes Ta of the transfer ring T as shown in FIG. 8. At this time, the lifters 108 are raised within a range in which the transfer ring T is not transferred to the second engaging portions 108b, and the raising of the lifters 108 is continued until the top portions of the first engaging portions 108a reach a second predetermined height. Here, the second predetermined height is the height at which the transfer arm 71 does not interfere with the edge ring E, the outer ring D, or the like when the transfer arm 71 is inserted into and removed from the gap between the outer ring D placed on the support 105 and the edge ring E supported by the first engaging portions 108a.

(Step S22: Unloading)

The edge ring E is unloaded from the plasma processing chamber 100 of the processing module 60.

Specifically, the transfer arm 71 is inserted into the decompressed plasma processing chamber 100 through a loading/unloading port (not shown). Then, the transfer arm 71 passes through the gap between the outer ring D placed on the support 105 and the edge ring E supported by the first engaging portions 108a of the lifters 108.

Next, all the lifters 108 are lowered, and the edge ring E is transferred from the first engaging portions 108a of the lifters 108 to the transfer arm 71. Then, the transfer arm 71 is withdrawn from the plasma processing chamber 100 and the edge ring E is unloaded from the processing module 60. The unloaded edge ring E is loaded into the storage module 61.

In this manner, a series of processes for removing only the edge ring E is ended.

Next, an example of a process of installing only the edge ring E will be described.

(Step S31: Loading)

First, the edge ring E in the storage module 61 is loaded into the plasma processing chamber 100 of the processing module 60 where the edge ring E will be installed by the transfer device 70.

Specifically, the edge ring E in the storage module 61 is held by the transfer arm 71 of the transfer device 70. Next, the transfer arm 71 holding the edge ring E is inserted into the plasma processing chamber 100 of the processing module 60 where the edge ring E will be installed through a loading/unloading port (not shown). At this time, the plasma processing chamber 100 may be in a depressurized state. Then, the edge ring E is transferred by the transfer arm 71 to a position above the upper surface 104b of the peripheral portion of the electrostatic chuck 104. At this time, the transfer ring T and the outer ring D are placed on the upper surface 105a of the support 105.

(Step S32: Placing)

Then, the edge ring E is placed on the electrostatic chuck 104 from the transfer device 70.

Specifically, all the lifters 108 are raised, and the edge ring E is transferred from the transfer arm 71 to the first engaging portions 108a of the lifters 108 that have passed through the holes Ta of the transfer ring T. At this time, the lifters 108 are raised until the top portions of the first engaging portions 108a reach the above-described second predetermined height.

Next, the transfer arm 71 is withdrawn from the plasma processing chamber 100. Further, the lifters 108 are lowered. Accordingly, the edge ring E is placed on the upper surface 104b of the peripheral portion of the electrostatic chuck 104.

In this manner, a series of processes for installing only the edge ring E is completed.

Figure 9:
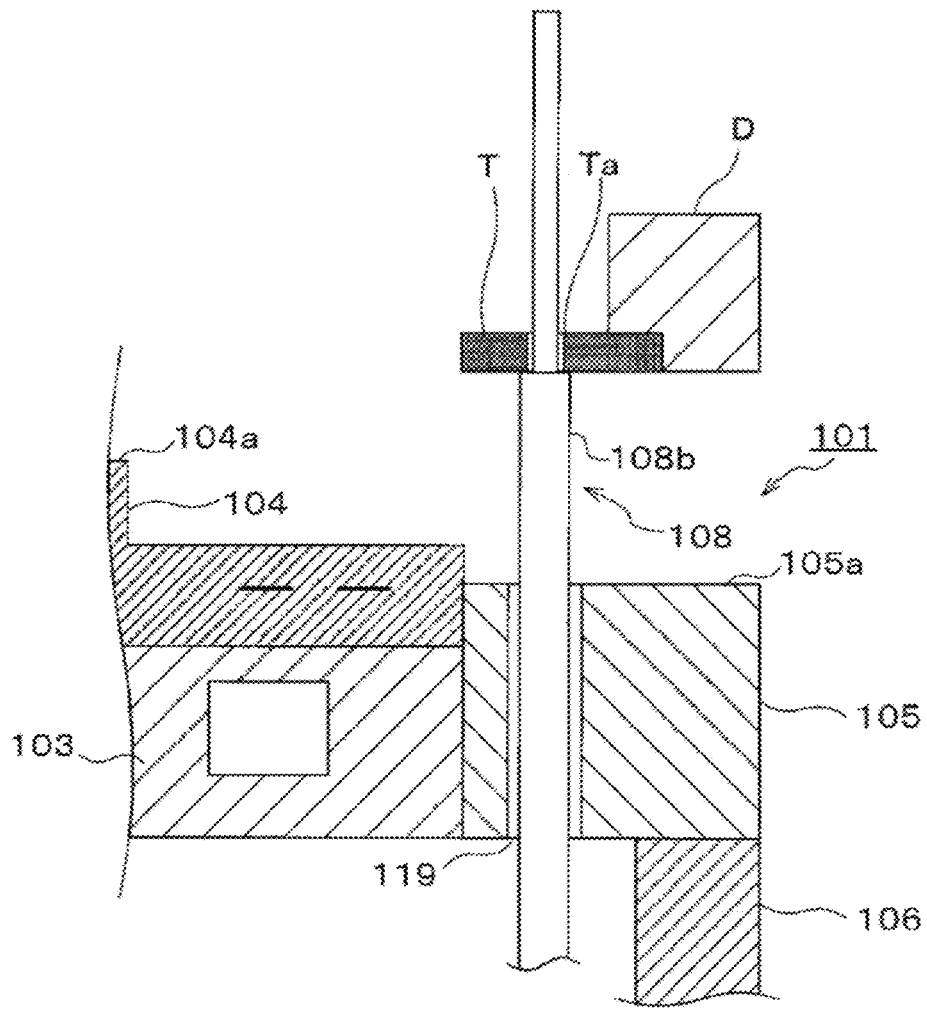
FIG. 9 shows the state of the vicinity of the wafer support during removal of the outer ring in a state where the edge ring has been removed.

Next, an example of a process of removing the outer ring D in a state where the edge ring E has been removed will be described with reference to FIG. 9. FIG. 9 shows the state of the vicinity of the wafer support 101 during the above process.

(Step S41: Transferring Outer Ring D)

First, the transfer ring T supporting the outer ring D is transferred from the electrostatic chuck 104 to the lifters 108.

Specifically, first, all the lifters 108 are raised, and the edge ring E is transferred to the engaging portions 108b of the lifters 108 that have passed through the insertion holes 119 and the holes Ta of the transfer ring T as shown in FIG. 9. At this time, the lifters 108 are raised until the top portions of the second engaging portions 108b reach the above-described first predetermined height.

(Step S42: Unloading)

Then, the transfer ring T supporting the outer ring D is unloaded from the plasma processing chamber 100 of the processing module 60.

Specifically, the transfer arm 71 is inserted into the depressurized plasma processing chamber 100 through a loading/unloading port (not shown). Then, the transfer arm 71 passes through the gap between the upper surface 104a of the central portion of the electrostatic chuck 104 and the transfer ring T supported by the second engaging portions 108b of the lifters 108 and the outer ring D supported by the transfer ring T.

Next, all the lifters 108 are lowered, and the transfer ring T supporting the outer ring D is transferred from the second engaging portions 108b of the lifters 108 to the transfer arm 71. Then, the transfer arm 71 is withdrawn from the plasma processing chamber 100 and the transfer ring T supporting the outer ring D is unloaded from the processing module 60. The transfer ring T supporting the outer ring D is loaded into the storage module 61.

In this manner, a series of processes for removing the outer ring D in a state where the edge ring E has been removed is completed.

Next, an example of a process of installing only the outer ring D will be described.

(Step S51: Loading)

First, the transfer ring T supporting only the outer ring D in the storage module 61 is loaded into the plasma processing chamber 100 of the processing module 60 where the outer ring D will be installed by the transfer device 70.

Specifically, the transfer ring T supporting only the outer ring D in the storage module 61 is held by the transfer arm 71 of the transfer device 70. Next, the transfer arm 71 holding the transfer ring T is inserted into the plasma processing chamber 100 of the processing module 60 where the outer ring D will be installed through a loading/unloading port (not shown). At this time, the plasma processing chamber 100 may be in a depressurized state. Then, the transfer ring T is transferred by the transfer arm 71 to a position above the upper surface 105a of the support 105. (Step S52: Placing)

Then, the edge ring E is placed on the electrostatic chuck 104 from the transfer device 70.

Specifically, all the lifters 108 are raised, and the transfer ring T supporting only the outer ring D is transferred from the transfer arm 71 to the second engaging portions 108b of the lifters 108 that have passed through the holes Ta of the transfer ring T. At this time, the lifters 108 are raised until the top portions of the second engaging portions 108b reach the above-described first predetermined height.

Then, the transfer arm 71 is withdrawn from the plasma processing chamber 100. Further, the lifters 108 are lowered. Accordingly, the outer ring D and the transfer ring T are placed on the upper surface 105a of the support 105.

In this manner, a series of processes for installing only the outer ring D is completed.

<Effect or the Like>

As described above, in the present embodiment, two types of rings, i.e., the edge ring E and the outer ring D, of the wafer support 101 can be replaced by the common lifters 108.

Further, in the present embodiment, the simultaneous replacement of the edge ring E and the outer ring D and the replacement of only the edge ring E can be selectively performed. Therefore, when the edge ring E is consumed more than the outer ring D, both the edge ring E and the outer ring D can be replaced at an appropriate timing. As a result, the lifetime of both rings can be increased.

Further, in the present embodiment, the edge ring E and the outer ring D can be replaced at the same time, so that the time required for the replacement can be shortened. Further, since the lifters 108 are commonly used for the edge ring E and the outer ring D, cost reduction and space saving can be achieved.

As described above, the transfer ring T may be made of SiC or a ceramic material. By using SiC or a ceramic material, the plasma resistance of the transfer ring T can be increased compared to the case of using $SiO_2$.

In the case of replacing both the edge ring E and the outer ring D, the edge ring E and the outer ring D are removed at the same time. Next, the edge ring E is installed using the transfer ring T and, then, only the edge ring E is installed without using the transfer ring T. Accordingly, both the outer ring D and the edge ring E can be installed at more appropriate positions.

<Modifications of Outer Ring and Transfer Ring>

Figure 10:
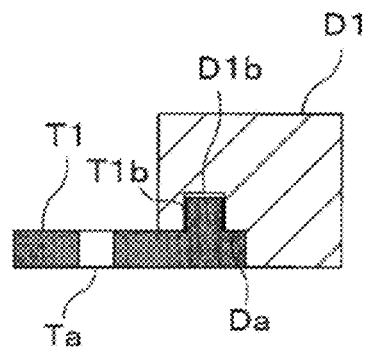
FIG. 10 shows another example of the outer ring and a transfer ring.

FIG. 10 shows another example of the outer ring and the transfer ring.

In order to avoid radial misalignment between the outer ring and the transfer ring, one of the rings may have a protrusion and the other ring may have a recess to be engaged with the protrusion. Specifically, as shown in FIG. 10, an upwardly recessed recess D1b (hereinafter, referred to as "annular recess") may be formed at the bottom surface of the inner peripheral portion of an outer ring D1 along the curve of the outer ring D1 in the entire circumference thereof. Further, an upwardly protruding protrusion T1b (hereinafter, referred to as "annular protrusion") may be formed at the upper surface of the outer peripheral portion of the transfer ring T1 to corresponding to the annular recess D1b along the curve of the transfer ring T1 in the entire circumference thereof. Due to the engagement between the annular recess D1b and the annular protrusion T1b, it is possible to suppress radial misalignment between the outer ring D1 and the transfer ring T1.

Instead of the above example, a protrusion may be formed at the bottom surface of the inner peripheral portion of the outer ring D1, and a recess having a shape corresponding to the protrusion of the outer ring D1 may be formed at the upper surface of the outer peripheral portion of the transfer ring T1. Accordingly, it is possible to suppress misalignment between the outer ring D1 and the transfer ring T1.

<Modification of Positioning of Outer Ring and Transfer Ring>

Figure 11:
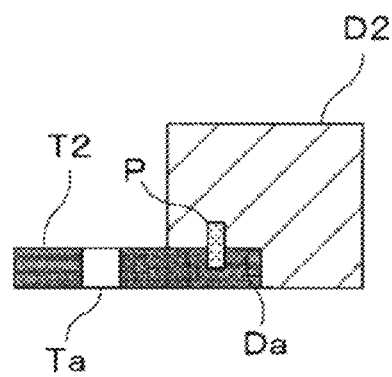
FIG. 11 shows another example of positioning of the outer ring and the transfer ring.

FIG. 11 shows another example of positioning of the outer ring and the transfer ring.

As shown in FIG. 11, the positioning of the outer ring D2 and the transfer ring T2 in the radial direction may be performed using positioning pins P inserted into both the bottom surface of the inner peripheral portion of the outer ring D2 and the upper surface of the outer peripheral portion of the transfer ring T2. The positioning pins P are columnar (more specifically, cylindrical) members extending in the vertical direction. Further, three or more positioning pins P are spaced apart from each other at intervals in the circumferential direction of the outer ring D2 and the transfer ring T2.

Further, when the outer ring has a thermal expansion coefficient lower than that of the transfer ring, the radial positioning of the outer ring and the transfer ring may be performed by the fitting between the inner peripheral portion of the outer ring and the outer peripheral portion of the transfer ring. Specifically, for example, the outer ring may have a portion into which the transfer ring is fitted to perform the above-described positioning. When the thermal expansion coefficient of the outer ring is lower than that of the transfer ring, the transfer ring and the outer ring are not damaged during thermal expansion of both the transfer ring and the outer ring thermally expand even if positioning is performed by the above-described fitting.

The transfer ring is made of a material having a higher electrical resistivity compared to that of the outer ring. In other words, the outer ring and the transfer ring are made of different materials. The positioning of the outer ring and the transfer ring in the radial direction may be performed by integrating the outer ring and the transfer ring made of different materials by welding or the like.

While various embodiments have been described above, the present disclosure is not limited to the above-described embodiments, and various additions, omissions, substitutions and changes may be made. Further, other embodiments can be implemented by combining elements in different embodiments.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate support comprising:
a substrate supporting portion;

a first ring disposed to surround the substrate supporting portion;

a second ring surrounding the first ring without overlapping the first ring in plan view such that an open gap is present between the first ring and the second ring;

a third ring disposed below the first ring and the second ring such that an inner portion of the third ring overlaps the first ring in plan view and an outer portion of the third ring overlaps the second ring in plan view, and having a through hole at the inner portion of the third ring;

a lifter having a first engaging portion protruding upward through the through hole in the third ring and engaged with the first ring and a second engaging portion disposed below the first engaging portion and engaged with the third ring around a bottom edge of the through hole; and an actuator configured to raise and lower the lifter.

2. The substrate support of claim 1, wherein the actuator raises and lowers the lifter having the second engaging portion engaged with the third ring to raise and lower the second ring engaged with the third ring.

3. The substrate support of claim 1, wherein the third ring is made of an insulating material or a conductive material having a higher electrical resistivity than a material of the first ring.

4. The substrate support of claim 1, wherein the first ring is made of a conductive material.

5. The substrate support of claim 1, wherein the first ring is an edge ring.

6. The substrate support of claim 1, wherein the second ring is made of a conductive material.

7. The substrate support of claim 1, wherein the second engaging portion is connected to the first engaging portion along an axial direction of the lifter, and has a projecting portion projecting from an outer periphery of the first engaging portion.

8. The substrate support of claim 1, wherein the actuator raises and lowers the lifter having the first engaging portion engaged with the first ring to raise and lower the first ring.

9. The substrate support of claim 1, wherein the actuator raises the lifter until a top portion of the first engaging portion reaches a predetermined height during transfer of the first ring.

10. The substrate support of claim 1, wherein the actuator raises the lifter until a top portion of the second engaging portion reaches a predetermined height during transfer of the third ring engaged with the second ring.

11. The substrate support of claim 1, wherein the actuator raises the lifter until a top portion of the first engaging portion reaches a predetermined height during transfer of the third ring engaged with the first ring and the second ring.

12. The substrate support of claim 1, further comprising:
a support disposed at an outer peripheral side of the substrate supporting portion, wherein the second ring and the third ring are placed on a ring supporting surface of the support.

13. The substrate support of claim 12, wherein the first ring is placed on another ring supporting surface between the ring supporting surface on which the second ring and the third ring are placed and the substrate supporting portion.

14. The substrate support of claim 13, further comprising:
an electrode that electrostatically attracts and holds the first ring on said another ring supporting surface; and
a gas supply mechanism configured to supply a heat transfer gas to a gap between said another ring supporting surface and a bottom surface of the first ring.

15. The substrate support of claim 1, wherein the actuator raises and lowers the lifter selectively engaged with only the first ring among the first ring, the second ring, and the third ring.

16. A plasma processing apparatus comprising:
the substrate support described in claim 1; and
a depressurizable processing chamber in which the substrate support is disposed.

17. The substrate support of claim 1, wherein the open gap has a width of 0.1 mm to 3 mm at room temperature.

18. A substrate support comprising:
a substrate supporting portion;
an outer ring disposed to surround the substrate supporting portion;
an inner ring disposed below the outer ring such that an outer portion thereof overlaps the outer ring in plan view and a protrusion protrudes upwardly from the inner ring into a recess in the outer ring;
a lifter having an engaging portion engaged with an inner portion the inner ring such that the lifter does not overlap with the outer ring in plan view; and
an actuator configured to raise and lower the lifter,
wherein the actuator raises and lowers the lifter having the inner ring engaged with the engaging portion to raise and lower the outer ring engaged with the inner ring.

19. A plasma processing apparatus comprising:
the substrate support described in claim 18; and
a depressurizable processing chamber in which the substrate support is disposed.

20. A method for replacing a ring of a substrate support, wherein the substrate support includes:
a substrate supporting portion;
a first ring disposed to surround the substrate supporting portion;
a second ring disposed to surround the first ring without overlapping the first ring in plan view such that an open gap is present between the first ring and the second ring;
a third ring disposed below the first ring and the second ring such that an inner portion of the third ring overlaps the first ring in plan view and an outer portion of the third ring overlaps the second ring in plan view, and having a through hole at the inner portion of the third ring; and
a lifter,
the method comprising:
transferring the first ring supported by a first engaging portion of the lifter protruding upward through the through hole in the third ring, and
transferring the third ring supported around a bottom edge of the through hole by a second engaging portion of the lifter together with the second ring, the second engaging portion being positioned below the first engaging portion.

* * * * *